United States Patent [19]
Weber

[11] 4,025,806
[45] May 24, 1977

[54] SUSPENSION AND PACKAGE FOR PIEZO-ELECTRIC RESONATORS

[75] Inventor: Claude Weber, Le Landeron, Switzerland

[73] Assignee: Societe Suisse pour l'Industrie Horlogere Management Services S.A., Bienne, Switzerland

[22] Filed: July 14, 1975

[21] Appl. No.: 595,502

[52] U.S. Cl. .............................................. 310/9.4
[51] Int. Cl.² ........................................ H01L 41/04
[58] Field of Search ......................... 310/9.1–9.4, 310/8.9

[56] References Cited
UNITED STATES PATENTS

| | | |
|---|---|---|
| 3,046,423 | 7/1962 | Wolfskill et al. .................. 310/9.1 |
| 3,221,189 | 11/1965 | Branot et al. .................. 310/9.4 X |

*Primary Examiner*—Mark O. Budd
*Attorney, Agent, or Firm*—Griffin, Branigan and Butler

[57] ABSTRACT

This invention provides a support arrangement for suspending a piezo-electric resonator which by providing a frame with cut out portions in its interior enables a resonator provided with suspension conductors to be placed in position by simple translation or rotation without in any way distorting the suspending conductors. Accordingly, the invention is well adapted to modern mass production methods.

7 Claims, 12 Drawing Figures

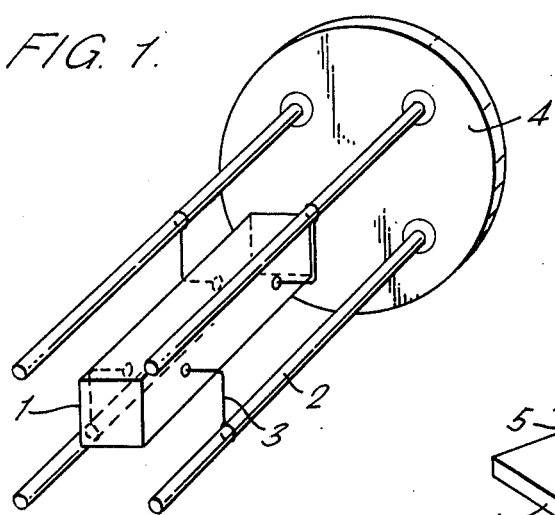
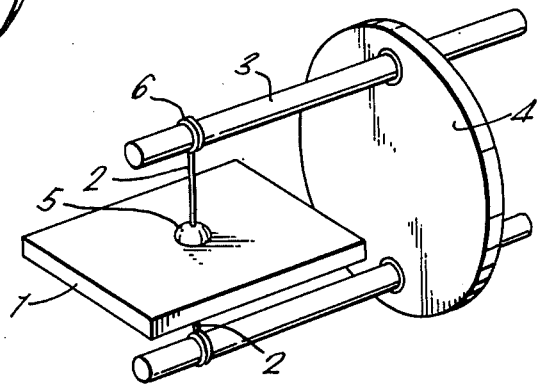
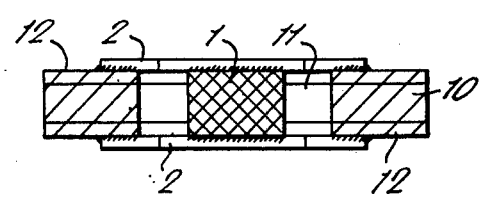
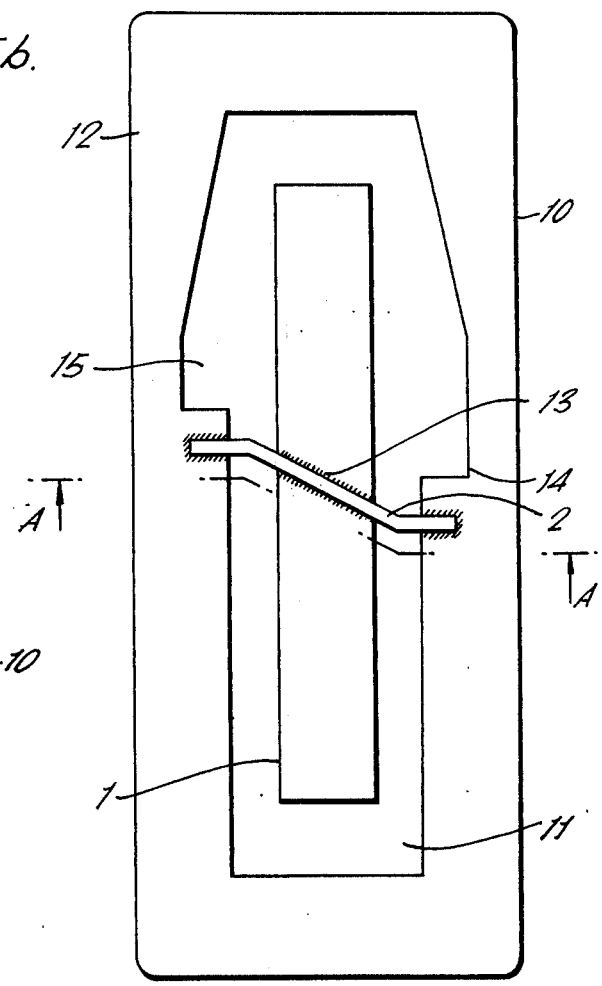

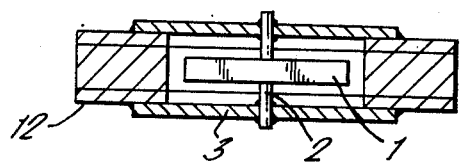
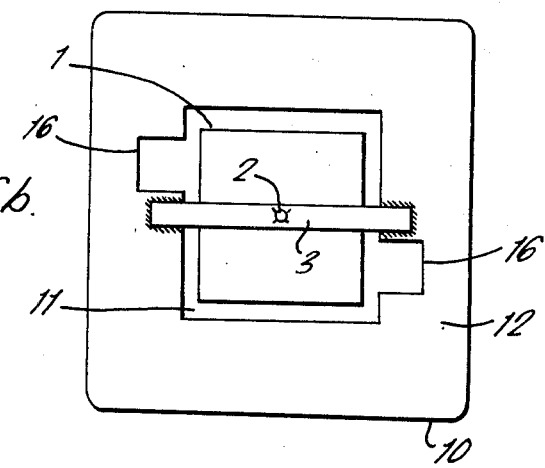
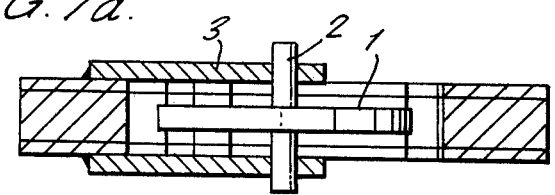
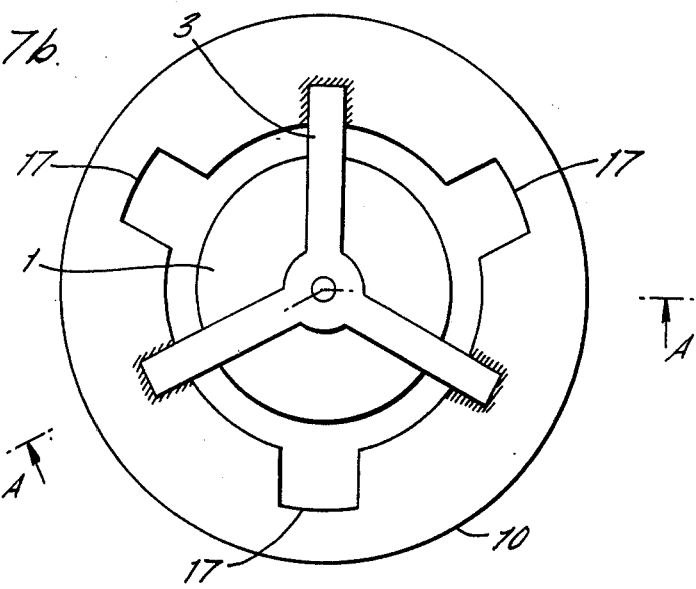

4,025,806

SUSPENSION AND PACKAGE FOR PIEZO-ELECTRIC RESONATORS

BACKGROUND OF THE INVENTION

In view of the ever increasing use of piezo-electric resonators in a wide variety of applications mass production methods become imperative in order that producers may keep pace with the demand. At the same time the resonators themselves in view of certain applications have become regularly smaller in their dimensions and particularly in applications such as wrist watches. They are nevertheless necessarily designed so as to withstand severe stresses. In general, thus it is the suspension which has had to be specifically designed and the designs thus far standard in the art, although generally responding well to the loads likely to be placed thereon, have caused considerable difficulties in terms of mass production. Thus, for example, in a timepiece utilizing a quartz resonator the resonator itself including of course its housing and assembly tends to be one of the most expensive single items. It is towards reducing the difficulties of mass production whilst retaining the basic reliability of known suspension means that the present invention is directed.

SUMMARY OF THE INVENTION

The invention provides a support for a piezo-electric resonator said resonator being provided with at least two suspension means which serve as conductive leads and each having at last two anchor points, the support comprising a frame formed of insulating material provided with metallized conductive zones and having an enclosed cut out of greater dimensions than the resonator alone but at last one dimension of which is less than that of the resonator with its attached supension means and at least one further cut out which with the first-named cut out provides a dimension greater than that of the resonator with its attached suspension means whereby the resonator may be placed into its proper location within the support by a movement of translation or rotation and without deforming the suspension means.

BRIEF DESCRIPTION OF THE DRAWINGS

FIGS. 1, 2, 3 and 4 each show prior art forms of suspension within a support or housing as applied to piezo-electric resonators of various types.

FIG. 5 shows a first form of the suspension according to this invention in sectional and plan views.

FIG. 6 shows a second form of the present invention in sectional and plan view.

FIG. 7 shows a third form of this invention in sectional and plan view.

DETAILED DESCRIPTION OF THE INVENTION

Figure 3A:
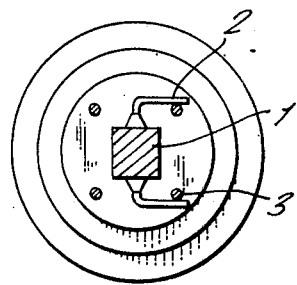
Figure 4A:
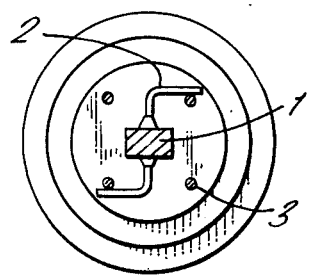
Figure 3B:
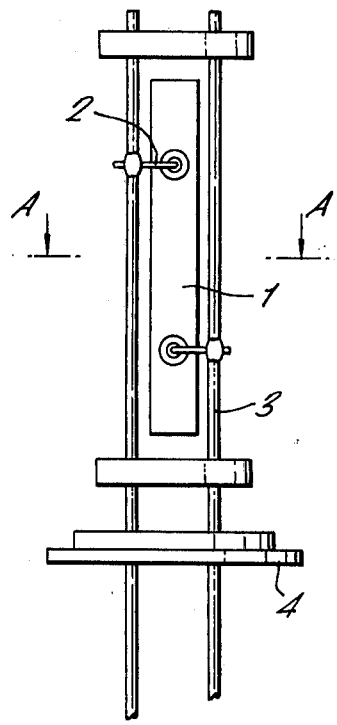
Figure 4B:
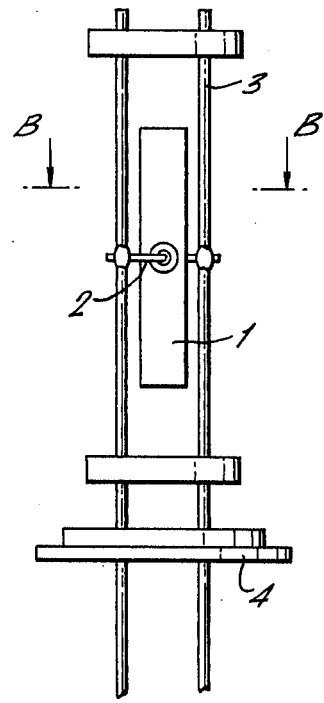

FIGS. 1 to 4 each show a piezo-electric resonator 1 suspended within a cage formed by wires 4 by means of electrically conductive leads 2. In each of the four types it will be appreciated that the specific arrangements as shown depend on the type of quartz resonator, for example the bar 1 as shown in FIG. 1 is intended to be illustrative of an X cut quartz vibrating in flexion. FIG. 2 is appropriate to a DT cut quartz vibrating in the surface shear mode. FIG. 3 again shows an X cut quartz, but from a different aspect insofar as the suspension connectors 2 are concerned. FIG. 4 finally shows also an X cut quartz wherein the nature of the electroding is to ensure working in the longitudinal vibration mode.

It will be apparent that when such resonators are reduced in dimension to the point where they may be readily installed in an electronic timepiece the suspending arrangements are such as will give considerable problems to employ mass production methods for manufacture. The attachement of the leads become critical and the placements of the assemblies increasingly difficult as the dimensions are reduced.

To overcome such prior art difficulties an arrangement such as shown for example in FIG. 5 may be employed in respect of quartz bars cut so as to vibrate longitudinally, i.e. an X cut quartz, similar for example to the quartz of the prior art arrangement as shown in FIG. 4. Herein a rectangular framework 10 is formed of an insulating material as for example a ceramic. A central portion of the frame 10 is cut out as shown at 11 and the opening thus provided serves to accomodate the piezo-electric bar 1 which may for example be an X cut quartz. The surfaces surrounding the opening 11 on both sides of the frame 10 are provided with metallizations 12 whereby such metallizations serve to connect the resonator to a circuit and at the same time serve to provide attachment means for retaining the resonator within the framework 10. The quartz bar 1 is provided with a suspension wire 2 on either side thereof and said suspension wire 2 is fixed to the quartz bar across a nodal zone 13 thereof by any suitable means such as soldering or brazing for example.

It will be observed that the cut out portion 11 of frame 10 increases in width in a stepped fashion whereby a first widening notch 14 is provided on one side thereof and a second widening notch 15 occurs in a staggered fashion on the other side. It thus becomes apparent that with such an attachment the procedure of assembling the resonator becomes substantially simplified. Thus the quartz bars may have initially applied thereto their metallizations and the support conductors whereupon to terminate the assembly it is sufficient to introduce the bar with its support wires into the widened sector of the cut out portion and thereafter slide the bar downwards as seen in FIG. 5B to the point where support wires 2 clamp either side of the frame 10. It will be apparent that the quartz bar 1 together with its support wires 2 has an overall lateral dimension less than that provided by the stepped part of the cut out 11 and less that provided by the remaining part of the cut out 11 whereby the quartz may be easily positioned and following such positioning may be securely fastened by means such as solering or brazing.

Although not shown it is clear that in the final assembly a cover member preferably of dished form may be placed on either side of the assembled frame and resonator and that portions of the frame may extend beyond the cover thereby to provide external connexions by virtue of the metallizations 12.

FIG. 6 shows a variation of the invention as might be applied for instance to a square or rectangular plate cut so as to vibrate in the surface shear mode, i.e. a DT cut quartz. Essentially the same principle is involved and it will be seen that the cut out portion 11 is likewise formed so as to conform to the shape of the resonator 1. Herein the cut out portion is provided with notches 16 on either side thereof and positioned so as to be rotationally symmetrical about the centre. Thus quartz bar 1 provided with support conductors 2 and 3 may be placed within framework 10 by locating the assembly so that support wires 3 are lined up with notches 16 and thereafter a simple rotation of the resonator with its support bars will bring the latter away from the notches and into contact with metallizations 12. Hereafter the assembly may be terminated by the usual soldering or brazing and as in the previous example dished cover members may be provided and thus the entire assembly hermetically sealed.

FIG. 7 is essentially similar to FIG. 6. In this case, however, the resonator is of circular form and the support wire as shown is in the form of a "Y". Three symmetrically located notches 17 are provided and it will be evident that as in the case of FIG. 6 once the resonator has been assembled with its support conductors 2 and 3 it is simply necessary to rotate it to a position in which the arms of the "Y" shaped support 3 coincide with notches 17 in the frame 10. Thereafter a simple rotation will bring the arms 3 to a clamping position where they may be fixed by the usual soldering or brazing. The completed assembly as in the previous example may be provided with a hermetically sealed cover.

What is claim is:

1. Support system for a piezo-electric resonator assembly comprising at least two approximately parallel suspension wires for supporting said piezo-electric resonator and for conducting electrical energy to said piezo-electric resonator, each of said suspension wires being attached to an opposite side of said resonator and each having at least two opposite anchor points for attaching to said support system, said support system further comprising a flat frame means for allowing said piezo-electric resonator to be easily mounted thereon without requiring the bending of said two suspension wires and for thereafter providing a convenient support to which said opposite anchor points of said suspension wires can be quickly fastened for support and electrical connection, said frame means having a thickness which is approximately the same as the distance between said anchor points of opposite suspension wires, and said frame means being formed of a middle layer of insulating material with metallized conductive layers covering the opposite sides thereof, said frame means having an enclosed first cut out of approximately the same shape as, but of greater dimensions than, the resonator alone, but a mounting dimension of said first cut out corresponding to the positions of said suspension wires on said resonator, said mounting dimension being substantially less than the lengths of the suspension wires to allow said anchor points to extend over frame means when said resonating assembly is in a mounting position, and at least two further cut out notches continuous with said first cut out and each being adjacent to the position of said mounting dimension of said first cut out, said further cut out notches, in combination with said first cut out, providing a dimension greater than that of the resonator assembly with its attached suspension wires to allow said resonator assembly to be inserted by a single translating movement into said cut outs until a suspension wire is positioned in the planes of the opposite sides of said frame, and to allow the resonator with its attached suspension wires to thereafter be moved with the suspension wire anchor points remaining approximately in the planes of the surfaces of the frame, to a proper mounting position with suspension-wire anchor points extending over said frame at the position of said mounting dimension, said support system further including anchor means for fastening said suspension-wire anchor points to said metallized conductive layers, whereby said resonator with its attached suspension wires may be moved into a position and fastened to said metallized conductive layers without deforming the suspension wires.

2. Support for a piezo-electric resonator as claimed in claim 1 wherein the frame means is adapted to accommodate a resonator in the form of an elongated bar having a single suspension wire on each of two opposed surfaces said suspension wires extending across the lateral dimensions of the bar and projecting a predetermined distance beyond each edge of the bar.

3. Support for a piezo-electric resonator as claimed in claim 2 wherein the frame means cut outs have a width greater than that of the resonator along and at one end thereof greater than that of the assembled resonator and suspension wires and at the other end less than that of the assembled resonator and suspension wires whereby the resonator may be placed in a retained posiion in the frame means by translation.

4. Support for a piezo-elctric resonator as claimed in claim 1 wherein the frame means is adapted to accommodate a resonator in the form of a square having a central suspension point on each opposed surface with a suspension bar attached to each suspension point and to a suspension wire parallel to each opposed surface, said suspension wires projecting a predeterined distance beyond each edge of the plate.

5. Support for a piezo-electric resonator as claimed in claim 4 wherein the frame means first cut out is in the form of a square of larger dimensions than the resonator alone and the further cut out notches are placed in a rotationally symmetrical fashion and together with the first cut out providing an opening of a greater dimension than that of the assembled resonator and suspension wires whereby the resonator may be placed in a retained position in the frame means by rotation.

6. Support for a piezo-electric resonator, said resonator being provided with at least two suspension means which serve as conductive leads and each having at least two anchor points, a support comprising a frame formed of insulating material provided with metallized conductive zone and having an enclosed cut out of approximately the same shape, but of greater dimensions than the resonator alone, but at least one dimension of which is less than that of the resonator with its attached suspension means and at least one further cut out continuous with said first cut out which with the first-named cut out provides a dimension greater than that of the resonator with its attached suspension means whereby the resonator may be placed into its proper location within the support by a movement of translation or rotation and without deforming the suspension means;

wherein the frame cut outs are adapted to accommodate a resonator in the form of a circular plate having a central suspension point on each opposed surface with a suspension wire attached to each suspension point and to a "Y" formed suspension bar parallel to each opposed surface, each arm of the "Y" projecting a predetermined distance beyond the circumferential edge of the plate.

7. Support for a piezo-electric resonator as claimed in claim 6 wherein the frame cut out is in the form of a circle of greater diameter than that of the resonator alone and is provided with three notches placed to conform to the proportions of the "Y" formed suspension bars said notches together with the cut out providing and opening of greater dimension than that of the assembled resonator and "Y" suspension bars whereby the resonator may be placed in a retained position in the frame by rotation.

* * * * *